(12) United States Patent
Yamaguchi

(10) Patent No.: US 6,381,195 B2
(45) Date of Patent: Apr. 30, 2002

(54) CIRCUIT, APPARATUS AND METHOD FOR GENERATING ADDRESS

(75) Inventor: Junichiro Yamaguchi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/740,012

(22) Filed: Dec. 20, 2000

(30) Foreign Application Priority Data

Dec. 21, 1999 (JP) .............................. 11-363169

(51) Int. Cl.[7] ................................................. G11C 8/00
(52) U.S. Cl. ........................................ 365/236; 365/233
(58) Field of Search ................................ 365/236, 233, 365/230.01; 327/339

(56) References Cited

U.S. PATENT DOCUMENTS 3,990,052 A * 11/1976 Gruner ........................ 712/248
6,249,167 B1 * 6/2001 Oguchi et al. .............. 327/291

* cited by examiner

*Primary Examiner*—Hoai V. Ho
(74) *Attorney, Agent, or Firm*—Oliff & Berridge, PLC

(57) ABSTRACT

A circuit and a method for generating an address, which can generate a plurality of types of address on the basis of a reference address, and an apparatus for generating an address, which can generate the different addresses from one another by using a plurality of circuits described above at a plurality of steps. The circuit (200) for generating an address, comprises: a multiplex counter (30) comprising a counter (31) for counting a pulse number of a clock signal to generate a count number represented by binary bit and a bit shift circuit (33) for shifting the count number, to generate an output count number; and an arithmetic circuit (20) for operating an address signal on the basis of the output count number and a reference address signal, to output the address signal to a semiconductor memory as an object of test.

6 Claims, 6 Drawing Sheets

FIG.4

| | CASE OF GENERATING AT TWO STEPS | | CASE OF GENERATING AT FOUR STEPS | |
|---|---|---|---|---|
| | 1 BIT SHIFT | | 2 BITS SHIFT | |
| FIRST (00, DECIMAL NUMBER: 0) | 00* | ⇧ 000 {0} / 001 {1} | 00** | ⇧ 0000 {0} , 0010 {2} / 0001 {1} ; 0011 {3} |
| SECOND (01, DECIMAL NUMBER: 1) | 01* | ⇧ 010 {2} / 011 {3} | 01** | ⇧ 0100 {4} , 0110 {6} / 0101 {5} ; 0111 {7} |
| THIRD (10, DECIMAL NUMBER: 2) | 10* | ⇧ 100 {4} / 101 {5} | 10** | ⇧ 1000 {8} , 1010 {10} / 1001 {9} ; 0011 {11} |
| FORTH (11, DECIMAL NUMBER: 3) | 11* | ⇧ 110 {6} / 111 {7} | 11** | ⇧ 1100 {12} , 1110 {14} / 1101 {13} ; 1111 {15} |

FIG.5

| SHIFT NUMBER | COUNT-UP NUMBER |
|:---:|:---:|
| 0 | +1 |
| 1 | +2 |
| 2 | +4 |
| ⋮ | ⋮ |
| m | $+2^m$ |
| ⋮ | ⋮ |

CIRCUIT, APPARATUS AND METHOD FOR GENERATING ADDRESS

BACKGROUND OF THE INVENTION

1. Field of the Invention

The present invention relates to a circuit, an apparatus and a method for generating an address in a semiconductor memory testing device.

2. Description of Related Art

The circuit for generating an address is one in a semiconductor memory testing device, for generating an address signal of a memory cell to be read (read out) or to be written (written in) at a high speed, on the basis of the predetermined algorithm.

FIG. 6 is a view showing an example of a circuit 100 for generating an address according to an earlier development. In FIG. 6, the circuit 100 for generating an address comprises a counter 10 and ALU (Arithmetic and Logic Unit) 20.

The counter 10 counts the pulse number of a clock pulse signal by +1, which gives a pulse as a clock and which is inputted from the outside of the circuit 100. Thereafter, the counter 10 outputs the count number to ALU 20.

When the count number is inputted from the counter 10 to ALU 20, ALU 20 carries on the predetermined operation on the basis of the count number and a reference address inputted from the outside of the circuit 100. Thereafter, ALU 20 outputs an address signal as the result of the predetermined operation. The address signal is an address for the semiconductor memory as an object of test.

Whenever the next pulse of the clock pulse signal is inputted to the counter 10, the counter 10 counts the pulse number of the clock pulse signal and outputs the count number to ALU 20. Accordingly, whenever the count number is inputted from the counter 10 to ALU 20, ALU 20 operates the count number and outputs the address signal one after another.

That is, the circuit 100 for generating an address operates on the reference address signal according to the input of the pulse of the clock pulse signal and outputs the address signal one after another.

However, according to the circuit 100 for generating an address according to an earlier development, the counter 10 only counts the pulse number of the clock pulse signal by +1. Accordingly, it is possible to generate the only predetermined address on the basis of the reference address.

Further, when a plurality of circuits 100 are used at a plurality of steps and carry on the predetermined operation on the basis of the common clock pulse signal and the common reference address signal, each circuit 100 outputs the same address signal. Consequently, it has been difficult to generate the different addresses from one another, by a plurality of circuits 100 at the same time.

SUMMARY OF THE INVENTION

The present invention was developed in view of the above-described problems.

An object of the present invention is to provide a circuit and a method for generating an address, which can generate a plurality of types of address on the basis of a reference address. Another object of the present invention is to provide an apparatus for generating an address, which can generate the different addresses from one another by using a plurality of circuits described above at a plurality of steps.

In accordance with one aspect of the present invention, a circuit (for example, a circuit 200 shown in FIG. 1) for generating an address, comprises: a multiplex counter (for example, a multiplex counter 30 shown in FIG. 1) comprising a counter (for example, a counter 31 shown in FIG. 2) for counting a pulse number of a clock signal to generate a count number (for example, "00", "01", "10" and "11" shown in FIG. 4) represented by binary bit and a bit shift circuit (for example, a bit shift circuit 33) for shifting the count number, to generate an output count number (for example, "000", "010", "100" and "110" shown in FIG. 4); and an arithmetic circuit (for example, ALU 20 shown in FIG. 1) for operating an address signal on the basis of the output count number and a reference address signal, to output the address signal to a semiconductor memory as an object of test.

The clock signal is a signal that gives a pulse as a clock, so that the clock signal is called a clock pulse signal in the preferred embodiment of the present invention.

According to the multiplex counter of the circuit as described above, the counter counts the pulse number of the clock signal to generate the count number represented by binary bit and the bit shift circuit shifts the count number, to generate the output count number.

Consequently, it is possible to output a plurality of types of the output count number from the multiplex counter, by changing a shift number of shifting the count number. Further, it is possible to change a count-up number of the output count number by changing the count number to the output count number.

Further, according to the arithmetic circuit of the circuit as described above, the arithmetic circuit operates the address signal to be inputted to a semiconductor memory as an object of test, on the basis of the output count number generated by shifting the count number and the reference address signal.

Consequently, it is possible to output a plurality of types of the address signal to a semiconductor memory as an object of test.

Preferably, in a circuit for generating an address, as described above, the multiplex counter (a multiplex counter 30 shown in FIG. 2) further comprises a storage unit (a register 32 shown in FIG. 2) for storing a predetermined number therein and an adder (an adder 34 shown in FIG. 2) for adding the predetermined number to the count number shifted by the bit shift circuit, to generate the output count number.

The predetermined number stored in the storage unit is not limited to a fixed number. For example, the predetermined number may be changed by an external signal or the like, as the occasion may demand.

According to the multiplex counter of the circuit as described above, for example, the adder adds the predetermined number stored in the storage unit to a free low bit occurred by shifting the count number, to generate the output count number.

Consequently, it is possible to generate the output count number having various numbers from one count number by adding the predetermined number to the count number shifted by the bit shift circuit, and it is possible to output various types of the output count number from the multiplex counter.

In accordance with another aspect of the present invention, an apparatus (an apparatus 500 shown in FIG. 3) for generating an address, comprises: a plurality of circuits (circuits 200-1 to 200-n shown in FIG. 3) as described above, wherein each circuit stores the different predetermined number from one another in the storage unit of the multiplex counter thereof (a register of each of multiplex counters 30-1 to 30-n shown in FIG. 3) and generates the different address signal from one another at the same time on the basis of the reference address signal.

According to the apparatus as described above, the predetermined number stored in the storage unit of the multiplex counter of each circuit is different from one another, so that the multiplex counter of each circuit outputs the different output count number from one another.

Consequently, it is possible for a plurality of circuits to generate the different address signals from one another at the same time on the basis of the reference address signal.

Preferably, an apparatus for generating an address, as described above, further comprises: a switching output circuit (a multiplexer 300 shown in FIG. 3) for switching a plurality of different address signals from one another, generated by a plurality of circuits at the same time, in order, to output a series of different address signals.

According to the apparatus as described above, the switching output circuit can switch a plurality of different address signals from one another, generated at the same time and output a series of different address signals. Consequently, it is possible to continuously output the different address signals from one another to a semiconductor memory.

Further, according to a change of the number of the steps of the circuits incorporated in the apparatus, the switching output circuit changes the speed of switches the address signals and outputting any one of the address signals. Consequently, it is possible to easily generate the different address signals from one another in order continuously. In this case, if the switching output circuit can operate at a high speed, it is unnecessary to change the circuits at all. As a result, it is possible to realize the circuit at a low cost.

In accordance with a further aspect of the present invention, a method for generating an address, comprises the steps of: counting a pulse number of a clock signal to generate a count number represented by binary bit; shifting the count number to generate an output count number; and operating an address signal on the basis of the output count number and a reference address signal, to output the address signal to a semiconductor memory as an object of test.

Preferably, a method for generating an address, as described above, further comprises the step of: adding a predetermined number to the count number shifted, to generate the output count number.

According to the method as described above, for example, the output count number is generated by adding the predetermined number stored in the storage unit to a free low bit occurred by shifting the count number.

Consequently, it is possible to generate the output count number having various numbers from one count number by adding the predetermined number to the count number shifted by the bit shift circuit, and it is possible to output various types of the output count number.

BRIEF DESCRIPTION OF THE DRAWINGS

The present invention will become more fully understood from the detailed description given hereinafter and the accompanying drawings which are given by way of illustration only, and thus are not intended as a definition of the limits of the present invention, and wherein:

FIG. 4 is a table showing corresponding relations between a shift number of shifting a count number and an output count number, according to a clock pulse signal;

Figure 5:
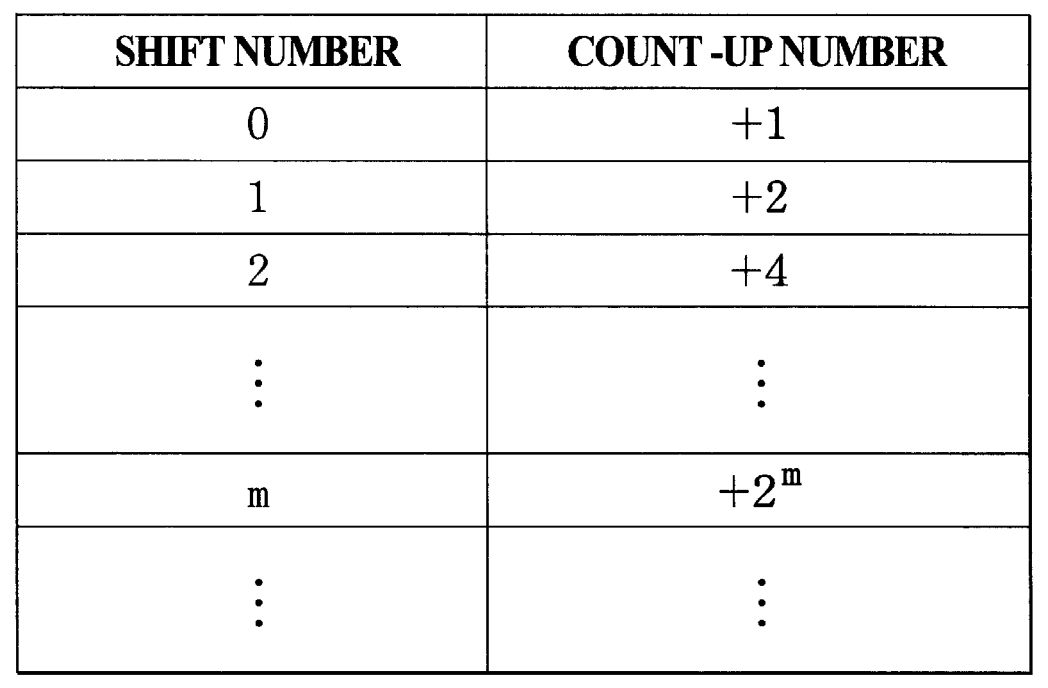

FIG. 5 is a table showing a corresponding relation between a shift number of shifting a count number and a count-up number of an output count number.

PREFERRED EMBODIMENT OF THE INVENTION

Hereinafter, an embodiment of the present invention will be explained with reference to FIGS. 1 to 5, in detail.

Figure 1:
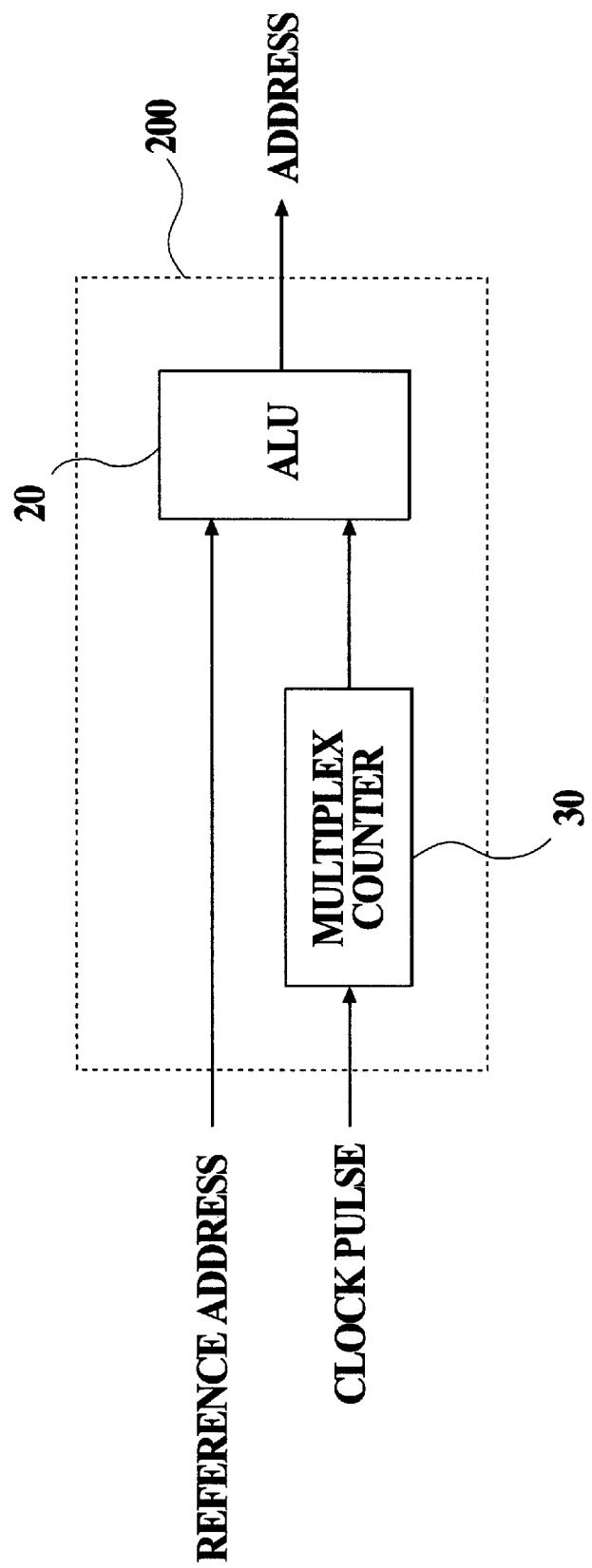
FIG. 1 is a block diagram showing an example of a circuit 200 for generating an address, according to an embodiment of the circuit of the present invention.
Figure 6:
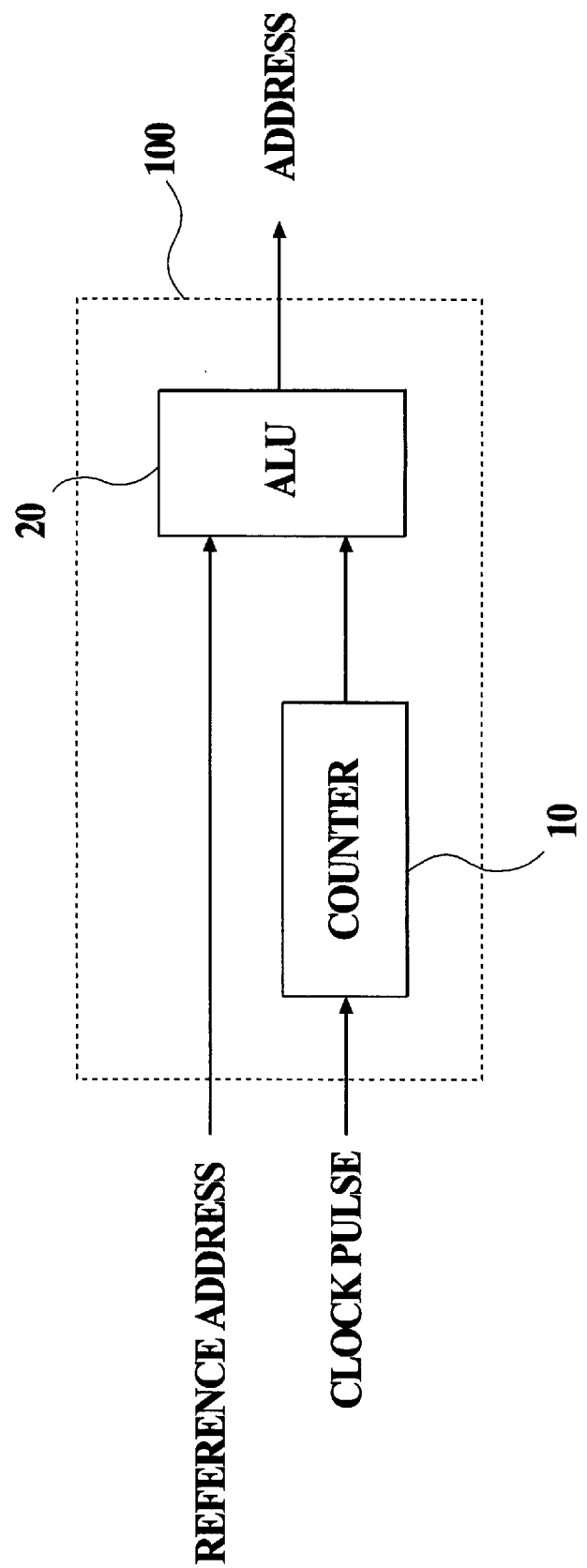
FIG. 6 is a block diagram showing an example of a circuit 100 for generating an address, according to an earlier development.

FIG. 1 is a block diagram showing an example of an internal structure of the circuit 200 for generating an address, according to an embodiment of the circuit for generating an address, of the present invention. In FIG. 1, the same reference numeral 20 are attached to ALU as the common element to ALU in the circuit 100 for generating an address, according to an earlier development shown in FIG. 6.

As shown in FIG. 1, the circuit 200 for generating an address comprises a multiplex counter 30 and ALU 20.

ALU 20 carries on a predetermined operation on the basis of a reference address signal inputted from the outside of the circuit 200 and an output count number inputted from the multiplex counter 30. Thereafter, ALU 20 outputs an address signal as a result of the operation and has the same function as one of ALU 20 according to an earlier development shown in FIG. 6.

Figure 2:
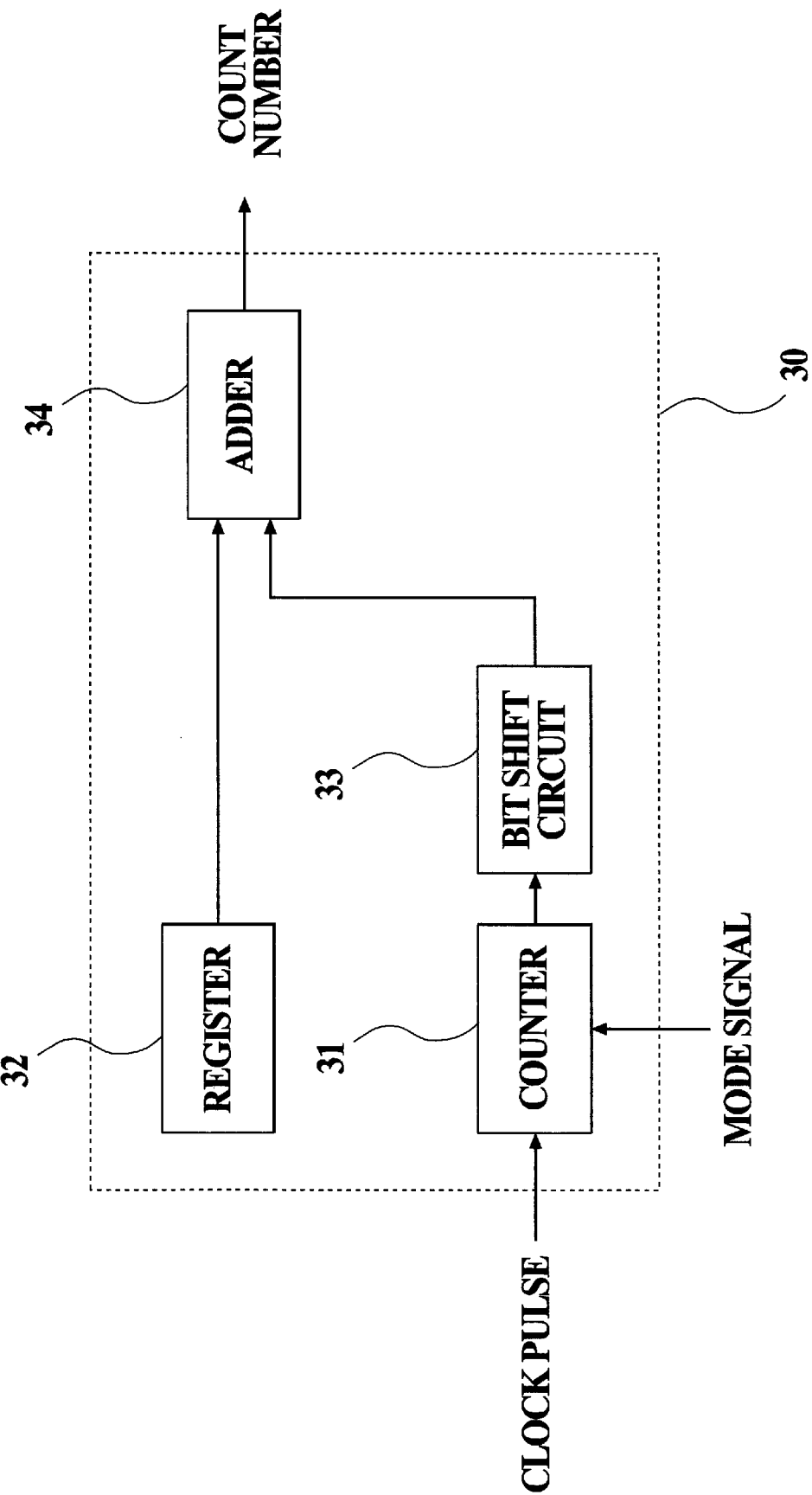
FIG. 2 is a block diagram showing an internal structure of a multiplex counter 30 of the circuit 200.

FIG. 2 is a block diagram showing an internal structure of the multiplex counter 30 as shown in FIG. 1. In FIG. 2, the multiplex counter 30 comprises a counter 31, a register 32, a bit shift circuit 33 and an adder 34.

The counter 31 counts the pulse number of the clock pulse signal inputted from the outside of the circuit 200, by +1, to generate a count number represented by binary bit. Thereafter, the counter 31 outputs the count number to the bit shift circuit 33. When the mode signal is inputted from the outside of the circuit 200 to the counter 31, the counter 31 clears the count number generated thereby, thereafter starts counting the pulse number of the clock pulse signal.

The bit shift circuit 33 shifts the count number inputted from the counter 31, thereafter outputs the result of shifting the count number to the adder 34. The shift number of shifting the count number is predetermined.

The register 32 stores an addend number therein, wherein the addend number is added to the count number shifted by the bit shift circuit 33.

When the count number shifted by the bit shift circuit 33 is inputted from the bit shift circuit 33 to the adder 34, the adder 34 adds the addend number stored in the register 32 to the count number shifted by the bit shift circuit 33, to generate an output count number. Thereafter, the adder 34 outputs the output count number to ALU 20.

Accordingly, the bit shift circuit 33 shifts the count number inputted from the counter 31 by m bit, thereby the count number shifted by the bit shift circuit 33 has a plurality of free bits at the low m bid thereof, temporarily. Thereafter, the adder 34 adds the addend number stored in the register 32 to the free bit of the count number, and generates the output count number. Consequently, it is possible to input the $2^m$ (m shows an exponent) type of addend number to the free bit of the count number shifted by the bit shift circuit 33. That is, the multiplex counter 30 can output the $2^m$ type of output count number.

Further, the bit shift circuit 33 shift the count number inputted from the counter 31 by m bit. Consequently, it is possible to generate the output count number having $2^m$ time as many numbers as the count number or having $2^m$ time as many numbers as the count number plus 1. That is, the multiplex counter 30 can count up by $+2^m$ bit, not by +1 bit, according to the clock pulse signal. The number of counting up the output count number is called a count-up number.

Figure 3:
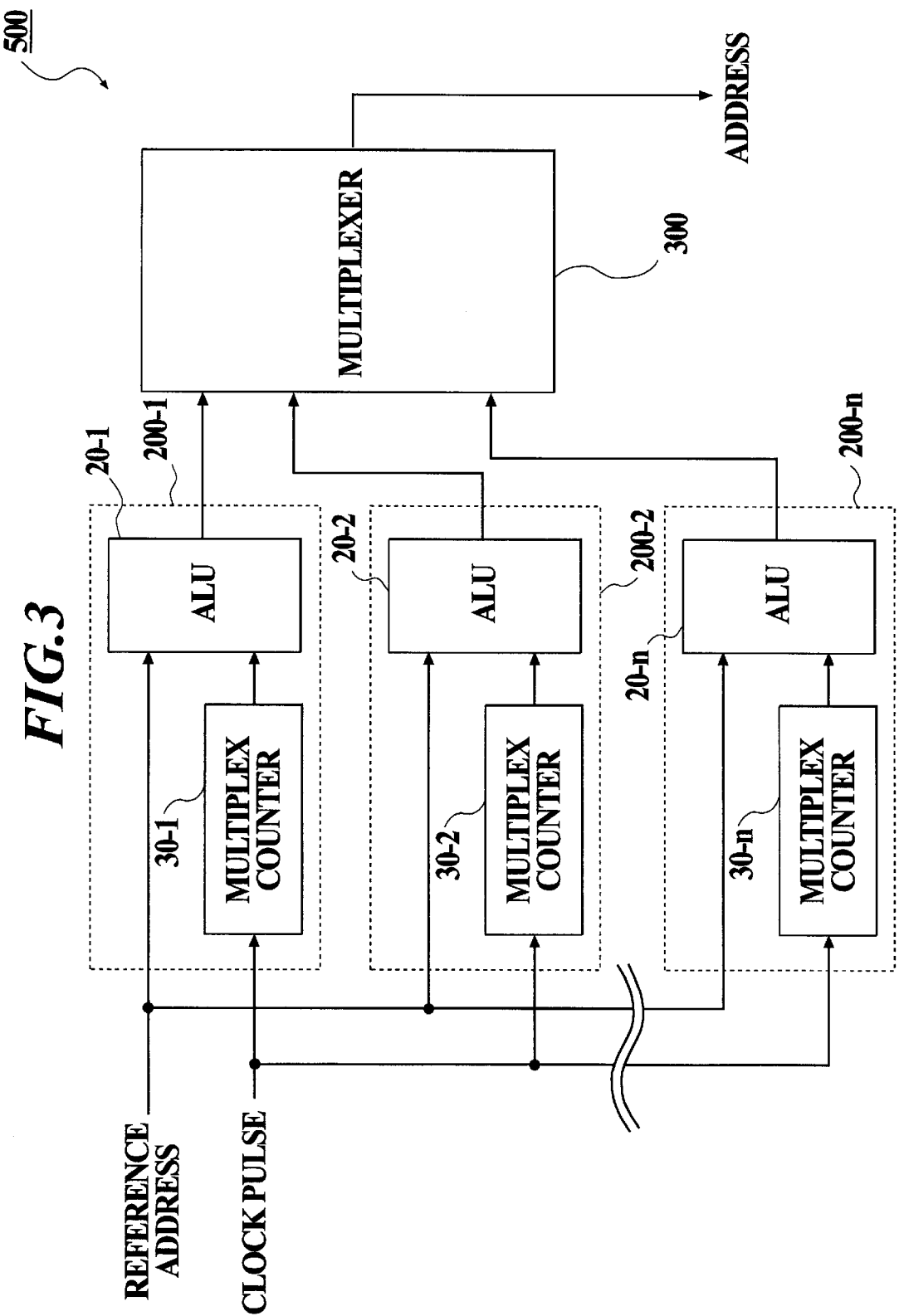
FIG. 3 is a block diagram showing an apparatus 500 for an address, composed of a plurality of circuits 200.

FIG. 3 is a block diagram showing a circuit 500 for generating an address, composed a plurality of n circuits 200 having the above-described structure and operating the above-described function at n steps (n is a natural number). Each circuit 200 (200-1, 200-2, . . . , and 200-n) stores the different addend number in the register 32 of the multiplex counter 30 (30-1, 30-2, . . . , and 30-n) thereof from one another. However, each circuit 200 has the same structure other than the addend number stored in the register 32. The common reference address and the common clock pulse signal are inputted to each circuit 200 for generating an address.

That is, according to each circuit 200 for generating an address, the register 32 of the multiplex counter 30 of each circuit 200 stores the different addend number from one another. Therefore, the adder 34 of the multiplex counter 30 of each circuit 200 outputs the different output count number from one another. Accordingly, each multiplex counter 30 outputs the different output count number from one another.

ALU 20 carries on the predetermined operation on the basis of the output count number and the reference address and outputs the address. Therefore, when the output count number to be inputted to each ALU 20 is different from one another, ALU 20 outputs the different address from one another. Accordingly, each circuit 200 outputs the different address from one another.

Each circuit 200 for generating an address outputs the address generated by the circuit 200 to the multiplexer 300.

The multiplexer 300 is a circuit for outputting a series of address signals by switching a plurality of address signals inputted from a plurality of circuits 100 at parallel, in order. The multiplexer 300 outputs a series of address signals by switching a plurality of addresses in a 1/n cycle of the clock pulse signal inputted to the circuit 200.

Further, according to the circuit 500, even if the step number n of the circuits 200 used by the circuit 500 is changed, the multiplexer 300 can generate a series of address signals by changing the cycle of switching a plurality of address signals.

That is, the circuit 500 uses a plurality of circuits 200 at a plurality of steps and the multiplexer 300 of the circuit 500 switches a plurality of address signals inputted from circuits 200 at a speed according to the number of steps of circuits 200. Thereby the circuit 500 can generate a series of address signals easily.

Next, the operation of the circuit 200 for generating an address will be explained as follows.

FIG. 4 is a table showing a corresponding relation between the shift number of shifting the count number and the output count number generated by shifting the count number, according to the clock pulse signal inputted to the counter, in the case that the circuit 500 uses two circuits 200 at two steps and four circuits 200 at four steps, respectively.

Firstly, an example that the bit shift circuit 33 shifts the count number inputted from the counter 31 by 1 bit will be explained as follows.

When the reference address signal is inputted to the circuit 200 for generating an address, the counter 31 of the multiplex counter 30 outputs the count number "00" to the bit shift circuit 33.

When the bit shift circuit 33 shifts the count number "00" inputted from the counter 31 by 1 bit, the least significant bit of the count number "00" becomes free and "00*" as the result of shifting the count number "00" is generated. When the bit shift circuit 33 outputs "00*" as the result of shifting the count number "00" to the adder 34, the adder 34 adds the addend number stored in the register 32 to "00*" inputted from the bit shift circuit 33.

Accordingly, the addend number stored in the register 32 is inputted to the least significant bit "*" of "00*". That is, when "0" or "1" is inputted to the least significant bit "*" of "00*", the output count number "000" or "001" is generated (the first time).

Next, when the next clock pulse signal is inputted to the circuit 200 for generating an address (the second time), the counter 31 counts up the count number by +1 and outputs the count number "01" to the bit shift circuit 33.

When the bit shift circuit 33 shifts the count number "01" inputted from the counter 31 by 1 bit, the least significant bit of the count number "01" becomes free and "01*" as the result of shifting the count number "01" is generated. When the bit shift circuit 33 outputs "01*" as the result of shifting the count number "01" to the adder 34, the adder 34 adds the addend number stored in the register 32 to "01*" inputted from the bit shift circuit 33.

In this case, because the addend number stored in the register 32 is not changed, "0" or "1" is inputted to the least significant bit "*" of "01*". Accordingly, the output count number "010" or "011" is generated.

From the third time on like the second time, whenever the clock pulse signal is inputted to the circuit 200 for generating an address, the counter 31 counts up the count number by +1 and outputs it to the bit shift circuit 33. The bit shift circuit 33 and the adder 34 carry on the operations as well as one at the second time.

As described above, when the count number (0, 1, 2, 3, . . . ) is inputted from the counter 31 to the bit shit circuit 33, the adder 34 outputs the output count number of either pattern of two ($=2^1$) patterns according as whether the addend number stored in the register 32 is "0" or "1", as follows.

Pattern A: (0, 2, 4, 6, . . . )
Pattern B: (1, 3, 5, 7, . . . )

That is, one multiplex counter 30 can output two patterns of output count numbers. In this case, the count-up number of the output count number is +2 ($=2^1$). According to the circuit 500 for generating an address, using two circuits 200 at two steps, the multiplex counter 30 shifts the count number by 1 bit, thereby the circuit 500 can obtain two patters of address signals from one circuit 200.

Further, an example that the bit shift circuit 33 shifts the count number inputted from the counter 31 by 2 bits can be explained like the example as described above, as follows.

When the reference address signal is inputted to the circuit 200 for generating an address, the counter 31 of the multiplex counter 30 outputs the count number "00" to the bit shift circuit 33.

When the bit shift circuit 33 shifts the count number "00" inputted from the counter 31 by 2 bits, the low 2 bits of the count number "00" becomes free and "00" as the result of shifting "00" is generated. When the bit shift circuit 33 outputs "00" as the result of shifting "00" to the adder 34, the adder 34 adds the addend number stored in the register 32 to "00**" inputted from the bit shift circuit 33.

Accordingly, the addend number stored in the register 32 is inputted to the low 2 bits "" of "00". That is, when "00", "01", "10" or "1s" is inputted to the low 2 bits "" of "00", the output count number "0000", "0001", "0010" or "0011" is generated (the first time).

Next, when the next clock pulse signal is inputted to the circuit 200 for generating an address (the second time), the counter 31 counts up the count number by +1 and outputs the count number "01" to the bit shift circuit 33.

When the bit shift circuit 33 shifts the count number "01" inputted from the counter 31 by 2 bits, the low 2 bits of the count number "01" becomes free and "01" as the result of shifting "01" is generated. When the bit shift circuit 33 outputs "01" as the result of shifting "01" to the adder 34, the adder 34 adds the addend number stored in the register 32 to "01**" inputted from the bit shift circuit 33.

In this case, because the addend number stored in the register 32 is not changed, "00", "01", "10" or "11" is inputted to the low 2 bits "" of "01". Accordingly, the output count number "0100", "0101", "0110" or "0111" is generated.

From the third time on like the second time, whenever the clock pulse signal is inputted to the circuit 200 for generating an address, the counter 31 counts up the count number by +1 and outputs it to the bit shift circuit 33. The bit shift circuit 33 and the adder 34 carry on the operation as well as one at the second time.

As described above, when the count number (0, 1, 2, 3, ...) is inputted from the counter 31 to bit shift circuit 33, the adder 34 outputs the output count number of either pattern of four (=$2^2$) patterns according as whether the addend number of the register 32 is "00", "01", "10" or "11", as follows.

Pattern A: (0, 4, 8, 12, ...)
Pattern B: (1, 5, 9, 13, ...)
Pattern C: (2, 6, 10, 14, ...)
Pattern D: (3, 7, 11, 15, ...)

That is, one multiplex counter 30 can output four patterns of output count numbers. In this case, the count-up number of the output count number is +4 (=$2^2$). According to the circuit 500 for generating an address, using four circuits 200 at four steps, the multiplex counter 30 shifts the count number by 2 bits, thereby the circuit 500 can obtain four patters of address signals from one circuit 200.

And further, in the case that the bit shift circuit 33 shifts the count number inputted from the counter 31 by more than 3 bits, the multiplex counter 30 operates the count number and outputs the output count number like the case as described above.

And further, in the case that the bit shift circuit 33 does not shift the count number inputted from the counter 31, the adder 34 does not add any addend number to the count number so that the multiplex counter 30 outputs the count number without operating it. In this case, the count-up number is +1.

As described above, when the bit shift circuit 33 shifts the count number inputted from the counter 31 by m bit, the low m bit of the count number shifted by the bit shift circuit 33 becomes free. The adder 34 adds the addend number stored in the register to the free low m bit, thereby it is possible to input $2^m$ patterns of addend numbers to the free low m bit.

Accordingly, the multiplex counter 30 can output $2^m$ patters of output count numbers and the count-up number of the output count number becomes +$2^m$.

FIG. 4 is a table showing a corresponding relation between the shift number of shifting the count number and the count-up number of the output count number.

According to each circuit 200 for generating an address, when the multiplex counter 30 of each circuit 200 outputs the output count number, ALU 20 of each circuit 200 carries on the predetermined operation on the basis of the output count number inputted from the multiplex counter 30 and the reference address, to generate the different address signal. Each circuit 200 outputs the address signal generated by the circuit 200 to the multiplexer 300. The multiplexer 300 switches a plurality of address signals inputted from circuits 200 at parallel in order, thereby outputs a series of address signals.

As described above, according to the circuit 500 using a plurality of circuits 200 at a plurality of steps, the addend number stored in the register 32 of each circuit 200 is different from the othes. Therefore, each circuit 200 generates the different address signal from one another. Accordingly, the multiplexer 300 switches a plurality of addresses signals outputted from circuits 200 in order, to generate a series of address signals.

Further, the multiplexer 300 can easily generate a series of address signals by changing the cycle of outputting a plurality of address signals in order, according to the step number of the circuits 200 used by the circuit 500.

Although the present invention has been explained according to the above-described embodiment, it should also be understood that the present invention is not limited to the embodiment and various changes and modifications may be made to the invention without departing from the gist thereof.

For example, although it is explained that the mode signal is inputted to the counter 31 to clear the count number from the counter 31, the mode signal may be inputted to the register 31 to change the addend number stored in the register 32.

According to the present invention, a main effect can be obtained, as follows.

According to the multiplex counter of the circuit of the present invention, the counter counts the pulse number of the clock signal to generate the count number represented by binary bit and the bit shift circuit shifts the count number, to generate the output count number. Consequently, it is possible to output a plurality of types of the output count number from the multiplex counter, by changing a shift number of shifting the count number. Further, it is possible to change a count-up number of the output count number by changing the count number to the output count number.

Further, according to the arithmetic circuit of the circuit of the present invention, the arithmetic circuit operates the address signal to be inputted to a semiconductor memory as an object of test, on the basis of the output count number generated by shifting the count number and the reference address signal. Consequently, it is possible to output a plurality of types of the address signal to a semiconductor memory as an object of test.

The entire disclosure of Japanese Patent Application No. Tokugan hei-11-363169 filed on Dec. 21, 1999 including specification, claims, drawings and summary are incorporated herein by reference in its entirety.

What is claimed is:

1. A circuit for generating an address, comprising:

a multiplex counter comprising a counter for counting a pulse number of a clock signal to generate a count number represented by binary bit and a bit shift circuit for shifting the count number, to generate an output count number; and an arithmetic circuit for operating an address signal on the basis of the output count number and a reference address signal, to output the address signal to a semiconductor memory as an object of test.

2. A circuit for generating an address, according to claim 1, wherein the multiplex counter further comprises a storage unit for storing a predetermined number therein and an adder for adding the predetermined number to the count number shifted by the bit shift circuit, to generate the output count number.

3. An apparatus for generating an address, comprising:

a plurality of circuits according to claim 2, wherein each circuit stores the different predetermined number from one another in the storage unit of the multiplex counter thereof and generates the different address signal from one another at the same time on the basis of the reference address signal.

4. An apparatus for generating an address, according to claim 3, further comprising:

a switching output circuit for switching a plurality of different address signals from one another, generated by a plurality of circuits at the same time, in order, to output a series of different address signals.

5. A method for generating an address, comprising the steps of:

counting a pulse number of a clock signal to generate a count number represented by binary bit;

shifting the count number to generate an output count number; and operating an address signal on the basis of the output count number and a reference address signal, to output the address signal to a semiconductor memory as an object of test.

6. A method for generating an address, according to claim 5, further comprising the step of:

adding a predetermined number to the count number shifted, to generate the output count number.

* * * * *